(12) United States Patent
Halot et al.

(10) Patent No.: US 6,946,162 B2
(45) Date of Patent: Sep. 20, 2005

(54) METHOD FOR PROVIDING A SEMITRANSPARENT METALLIC ASPECT TO COSMETIC CASE OR COMPACT COMPONENTS AND RESULTING COMPONENTS

(75) Inventors: Bruno Halot, Sennecey le Grand (FR); Vincent Regnier, Tournus (FR)

(73) Assignee: Rexam Beaute Mettallisation (FR)

( * ) Notice: Subject to any disclaimer, the term of this patent is extended or adjusted under 35 U.S.C. 154(b) by 43 days.

(21) Appl. No.: 10/363,782

(22) PCT Filed: Aug. 23, 2001

(86) PCT No.: PCT/FR01/02661
§ 371 (c)(1),
(2), (4) Date: Jul. 30, 2003

(87) PCT Pub. No.: WO02/20282
PCT Pub. Date: Mar. 14, 2002

(65) Prior Publication Data
US 2004/0026419 A1 Feb. 12, 2004
(Under 37 CFR 1.47)

(30) Foreign Application Priority Data
Sep. 4, 2000 (FR) .............................. 00 11238

(51) Int. Cl.[7] .................. C23C 14/02; C23C 14/20; C23C 14/26; B32B 15/08
(52) U.S. Cl. ................... 427/250; 427/404; 427/407.1; 427/412.1; 427/412.5
(58) Field of Search ................. 427/585, 250, 427/404, 407.1, 412.1, 412.5; 428/35.7, 38, 457, 458, 542.2; 204/192.1, 192.14, 192.15; 206/581, 823

(56) References Cited

U.S. PATENT DOCUMENTS

| 4,208,144 | A | | 6/1980 | Idec et al. .................. 401/192 |
| 4,364,792 | A | * | 12/1982 | Gliem et al. .................. 216/87 |
| 4,422,545 | A | | 12/1983 | Kadoory .................. 206/45.34 |
| 4,552,829 | A | | 11/1985 | Masaki ...................... 430/258 |
| 4,678,690 | A | | 7/1987 | Palmer et al. ................ 428/31 |
| 4,975,310 | A | * | 12/1990 | Nagano ..................... 428/64.4 |
| 5,091,232 | A | | 2/1992 | Coburn, Jr. ................. 428/40 |
| 5,431,177 | A | | 7/1995 | Kecman ..................... 132/303 |
| 5,431,978 | A | * | 7/1995 | Nakamura et al. ......... 428/64.6 |
| 5,840,431 | A | | 11/1998 | Kall ........................ 428/542.2 |
| 6,099,930 | A | * | 8/2000 | Cyr et al. .................. 428/64.1 |

FOREIGN PATENT DOCUMENTS

| DE | 3612694 | 10/1987 |
| EP | 1016516 | 7/2000 |
| GB | 2072095 | 9/1981 |
| GB | 2210826 | 6/1989 |

OTHER PUBLICATIONS

International Search Report.

* cited by examiner

*Primary Examiner*—Timothy Meeks
*Assistant Examiner*—Wesley D. Markham
(74) *Attorney, Agent, or Firm*—Ostrolenk, Faber, Gerb & Soffen, LLP

(57) ABSTRACT

The invention concerns a method for providing a semitransparent metallic aspect to a rigid component of a cosmetic case or analogue, made of transparent plastic material capable of being metal-coated. Said method is characterized in that it consists in depositing by physical vacuum vapour phase deposition a metal film sufficiently thin not to be opaque, and in covering said thin film with varnish.

8 Claims, No Drawings

METHOD FOR PROVIDING A SEMITRANSPARENT METALLIC ASPECT TO COSMETIC CASE OR COMPACT COMPONENTS AND RESULTING COMPONENTS

BACKGROUND OF THE INVENTION

The present invention relates to rigid components of cases, containers or packaging for cosmetic products, especially makeup cases, applicators for lipstick or the like, mascara cases, vaporizer stoppers, etc.

It is known practice to make these components from metalized rigid plastic, which gives them the opaque appearance and the brightness of a metallic component.

The metalization of plastic may be performed via a wet route (electrolytic deposition by catalysis, as described in document EP 1 016 516) or via a dry route (vacuum deposition and especially physical vapor-phase deposition, for example by evaporation under vacuum or cathodic sputtering). A chosen color can be given to the metallic coating by varying the nature of the metal used and the varnishes covering it.

It is moreover known practice to use more or less transparent components in the cosmetics field, for example in documents U.S. Pat. Nos. 4,208,144, 4,422,545 or 5,431,177. It is also known practice to dye these components, and also optionally to incorporate into the dye metallic or pearlescent pigments intended to give the component a metallic or pearlescent gloss effect. However, the effect thus obtained is generally of poor quality, and is even poorer when a light metallic gloss is desired; the reason for this is that the dispersion of small amounts of metallic pigments into the bulk of the plastic is relatively difficult and leads to large heterogeneities.

SUMMARY OF THE INVENTION

The aim of the invention is to make it possible to obtain a satisfactory metallic effect on cosmetic components, while at the same time maintaining a certain level of transparency.

The aim of the invention is achieved by means of a process for giving a semitransparent metalized appearance to a rigid component of a cosmetic case or the like made of metalizable transparent plastic, characterized in that a metal film that is thin enough not to be opaque is deposited by a physical vacuum vapor-phase deposition process, and said thin film is covered with a varnish. The invention also relates to the components thus obtained.

Specifically, the Applicant has found that by controlling the parameters of the vacuum deposition process, and especially by reducing the amount of metal vaporized in the vacuum chamber, it is possible to produce a very thin metal film, which is in fact discontinuous at the microscopic level, and which gives a uniform metallic appearance without removing the transparency. The effect is particularly attractive and unexpected; it depends in particular on the observation conditions, the transparency being more or less evident depending on the lighting in the room, the light passing into the room, etc., to the point that it is possible, depending on the case, to perceive different shades ranging from an almost normal transparent appearance to an almost completely metalized appearance.

DESCRIPTION OF THE PREFERRED EMBODIMENT

The process comprises the following steps:

The starting material used is a piece of transparent rigid plastic, optionally dyed in the bulk. The plastic may be, for example, a transparent styrene resin such as SAN (styrene-acrylonitrile) or ABS (acrylonitrile-butadiene-styrene).

A surface preparation is performed, where appropriate, for example by ion bombardment or with a coat (referred to hereinbelow as the undercoat) of colored or uncolored varnish. The varnish may be a UV-photocurable varnish to make the surface very glossy.

The undercoat varnish (if present) is polymerized by ultraviolet radiation.

The varnished component is placed in a chamber that is placed under vacuum.

In this chamber, a metallic component is heated by means of the Joule effect (for example using a crucible containing said component and directly heated by the Joule effect, by means of a resistor surrounding said component), The metal may especially be aluminum, chromium, nickel or copper, or may be contained in an alloy based on one or more of these metals. The amount of metal to be used is determined by experimentation on the basis of the desired result.

The evaporation of the metal and its recondensation on the component gives rise to the thin (a few Angströms thick) metallic deposit in accordance with the invention.

This thin deposit is then protected with a glossy or matte, colored or uncolored, optionally photo-curable varnish.

Various manufacturing examples were performed using components (vaporizer caps) made of nondyed transparent ABS, with a blue undercoat. The deposition by vacuum evaporation was performed under "rustic" conditions by placing a piece of stainless steel, composed mainly of iron, chromium and nickel, in a crucible in the chamber. The metalized plastic components obtained had an attractive semitransparent and semireflective appearance.

What is claimed is:

1. A process for giving a semitransparent metalized appearance to a rigid component made of metalizable transparent plastic, the process comprising
   depositing a metal film that is thin enough not to be opaque on the plastic by a physical vacuum vapor-phase deposition process, wherein the metal deposited is chromium or copper and the metal is obtained from stainless steel; and
   covering the thin film with a varnish.

2. The process as claimed in claim 1, wherein the deposition process is performed by vacuum evaporation.

3. The process as claimed in claim 1, further comprising prior to the depositing, preparing a transparent plastic component as the rigid component.

4. The process as claimed in claim 3, further comprising prior to the depositing, applying a surface preparation comprising applying a varnish undercoat to the rigid component.

5. The process as claimed in claim 4, further comprising after preparing the component, preparing the surface of the component for receiving a deposited metal film.

6. The process as claimed in claim 3, further comprising after preparing the component, preparing the surface of the component for receiving a deposited metal film.

7. The process as claimed in claim 1, wherein the plastic component is made of styrene resin.

8. A process for giving semitransparent metalized appearance to a rigid component made of metalizable transparent plastic, the process comprising
   preparing a transparent plastic component as the rigid component by applying a surface preparation comprising a varnish undercoat, wherein the varnish undercoat is colored;
   then depositing a metal film that is thin enough not to be opaque on the plastic by a physical vacuum vapor-phase deposition process; and
   covering the thin film with a varnish.

* * * * *